US009639450B2

(12) United States Patent  
Manolios

(10) Patent No.: US 9,639,450 B2  
(45) Date of Patent: May 2, 2017

(54) SCALABLE METHODS FOR ANALYZING FORMALIZED REQUIREMENTS AND LOCALIZING ERRORS

(71) Applicant: General Electric Company, Schenectady, NY (US)

(72) Inventor: Panagiotis Manolios, Sharon, MA (US)

(73) Assignee: General Electric Company, Niskayuna, NY (US)

( * ) Notice: Subject to any disclaimer, the term of this patent is extended or adjusted under 35 U.S.C. 154(b) by 10 days.

(21) Appl. No.: 14/742,028

(22) Filed: Jun. 17, 2015

(65) Prior Publication Data

US 2016/0371167 A1 Dec. 22, 2016

(51) Int. Cl.
*G06F 9/44* (2006.01)
*G06F 11/36* (2006.01)
*G06F 17/50* (2006.01)

(52) U.S. Cl.
CPC ............ *G06F 11/3608* (2013.01); *G06F 8/10* (2013.01); *G06F 8/20* (2013.01); *G06F 17/504* (2013.01)

(58) Field of Classification Search
CPC .......... G06F 8/20; G06F 11/3608; G06F 8/10; G06F 17/504
USPC ........................................................ 717/104
See application file for complete search history.

(56) References Cited

U.S. PATENT DOCUMENTS

| | | | |
|---|---|---|---|
| 6,099,575 A | 8/2000 | Hardin et al. | |
| 7,469,170 B2 | 12/2008 | Flores et al. | |
| 7,970,601 B2 | 6/2011 | Burmester et al. | |
| 8,516,449 B2 | 8/2013 | Artzi et al. | |
| 8,589,889 B2 | 11/2013 | Kim et al. | |

(Continued)

FOREIGN PATENT DOCUMENTS

| | | |
|---|---|---|
| EP | 1672547 A1 | 6/2006 |
| WO | 2008124038 A1 | 10/2008 |

OTHER PUBLICATIONS

Alexander Egyed et al., "Identifying Requirements Conflicts and Cooperation: How Quality Attributes and Automated Traceability Can Help", 2004, IEEE Computer Society, pp. 50-58.*

(Continued)

*Primary Examiner* — Ted T Vo  
(74) *Attorney, Agent, or Firm* — Nitin N. Joshi

(57) ABSTRACT

According to some embodiments, a system and method are provided for analyzing formal system requirements for software and hardware components in a software and hardware component specification model comprising receiving at least one requirement defined using a formal notation; determining if each of the requirements is self-conflicting via execution of a self-conflicting module; determining if two or more requirements conflict with each other via execution of a set-conflicting module after execution of the self-conflicting module; identifying each requirement involved in a conflict and how the one or more requirements conflicts via execution of an error localization module; receiving an updated requirement; repetitively analyzing each updated requirement with the self-conflicting module and the set-conflicting module; and generating an indication that requirements analysis is complete for the one or more requirements and the one or more requirements is validated for use in software design. Numerous other aspects are provided.

20 Claims, 7 Drawing Sheets

(56) References Cited

U.S. PATENT DOCUMENTS

| | | | | |
|---|---|---|---|---|
| 8,671,101 | B2* | 3/2014 | Verma | G06Q 10/10 707/748 |
| 8,775,226 | B2* | 7/2014 | Oberhofer | G06Q 10/00 705/7.11 |
| 8,990,308 | B2* | 3/2015 | Wiig | G06Q 10/10 709/205 |
| 2006/0184342 | A1 | 8/2006 | Narain | |
| 2011/0041116 | A1 | 2/2011 | Sampath et al. | |
| 2011/0258607 | A1 | 10/2011 | Bhatt et al. | |
| 2012/0143570 | A1 | 6/2012 | Austin et al. | |
| 2014/0189462 | A1 | 7/2014 | Rohleder et al. | |

OTHER PUBLICATIONS

Alexander Egyed et al., "A Comparison Study in Software Requirements Negotiation", 1998, Proceedings of the 8th Annual International Symposium on Systems Engineering, 8 pages.*

Siegl, Sebastian et al., "Model Based Requirements Analysis and Testing of Automotive Systems with Timed Usage Models", 2010, 18th IEEE International Requirements Engineering Conference, DOI: 10.1109/RE.2010.49, (pp. 345-350, 6 total pages).

Halfond, William G.J. et al., "Using Positive Tainting and Syntax-Aware Evaluation to Counter SQL Injection Attacks", SIGSOFT'06/FSE-14, Nov. 5-11, 2006, Portland, Oregion, USA, ACM 1-59593-468-5/06/0011, 11pgs.

Wing: "A specifier's introduction to formal methods", Computer, IEEE, Sep. 1, 1990, pp. 8-22, vol. No. 23, Issue No. 9, US, XP011416346, ISSN: 0018-9162, DOI: 10.1109/2.58215.

De Jong et al.,"Refinement in Requirements Specification and Analysis: a Case Study", IEEE, Apr. 3, 2000, pp. 290-298, Los Alamitos, USA, XP01 0376846, DOI: 10.11 09/ECBS.2000.839888 ISBN: 978-0-7695-0604-3.

Boddu et al.,"RETNA: From Requirements to Testing in a Natural Way", Proceedings. 12th IEEE International Requirements Engineering Conference, Sep. 6, 2004, pp. 244-253, Japan, XP010725432, DOI: 10.11 09/ICRE. 2004.1335683 ISBN: 978-0-7695-2174-9.

European Search Report and Opinion issued in connection with corresponding European Application No. 16174454.5 on Nov. 29, 2016.

* cited by examiner

400

...

//R18 Turn on TemperatureWarning when ExternalTemperature is less than or
//equal to Temperature Low.
Requirement 18: TempFunc shall set TemperatureWarning to On when
ExternalTemperature is less than or equal to TemperatureLow.

//R19 Turn off TemperatureWarning when ExternalTemperature is greater than
//Temperature Low.
Requirement 19: TempFunc shall set TemperatureWarning to Off when
ExternalTemperature is greater than TemperatureLow.

...

//R32 Turn off TemperatureWarning when TemperatureWarningMode is Off.
Requirement 32: TempFunc shall set TemperatureWarning to Off when
TemperatureWarningMode is Off.

//R18 Turn on TemperatureWarning when ExternalTemperature is less than or
//equal to Temperature Low.
Requirement 18: TempFunc shall set TemperatureWarning to On when
ExternalTemperature is less than or equal to TemperatureLow.

//R32 Turn off TemperatureWarning when TemperatureWarningMode is Off.
Requirement 32: TempFunc shall set TemperatureWarning to Off when
TemperatureWarningMode is Off.

//R18 Turn on TemperatureWarning when ExternalTemperature is less than or
//equal to Temperature Low and TemperatureWarningMode is On.
Requirement 18: TempFunc shall set TemperatureWarning to On when
ExternalTemperature is less than or equal to TemperatureLow
and TemperatureWarningMode is On.

//R19 Turn off TemperatureWarning when ExternalTemperature is greater than
//Temperature Low.
Requirement 19: TempFunc shall set TemperatureWarning to Off when
ExternalTemperature is greater than TemperatureLow.

...

//R32 Turn off TemperatureWarning when TemperatureWarningMode is Off.
Requirement 32: TempFunc shall set TemperatureWarning to Off when
TemperatureWarningMode is Off.

SCALABLE METHODS FOR ANALYZING FORMALIZED REQUIREMENTS AND LOCALIZING ERRORS

BACKGROUND

Developing a system with software and hardware components often involves system requirements provided by a customer. These requirements are used to design the system. Often, many errors in software and hardware components are introduced early (e.g., during requirement capture phases) but may not be discovered until later in the component creation process. Typically, the larger the distance between error introduction and error discovery, the larger the cost associated with fixing the error.

Therefore, it would be desirable to design an apparatus and method that provides for an earlier detection of requirements errors.

BRIEF DESCRIPTION

According to some embodiments, requirements are verified and validated by a formal requirements analysis module. The formal requirements analysis module may include a type-safety module, a contingency module, a global-contingency module, an independence module, a self-conflicting module, a set-conflicting module, a completeness module, a conditional-completeness module, a surjectivity module, a partial-surjectivity module and a conditional-surjectivity module, that are each successively applied to the requirements. If a requirement does not satisfy the analysis, in one or more embodiments a counter-example is generated and displayed to a user via execution of an error-localization module. The user is then able to edit the requirements identified by the error-localization module, and apply the formal requirements analysis module again to validate and verify the updated requirement. In one or more embodiments, after the requirements are verified and validated, the requirements are transmitted for development of the next stage of design, incorporating the verified and validated requirements.

A technical effect of some embodiments of the invention is an improved technique and system for validating and verifying requirements. With this and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DRAWINGS

FIG. 4 illustrates a user interface according to some embodiments.

FIG. 5 illustrates a model according to some embodiments.

FIG. 6 illustrates a model according to some embodiments.

DETAILED DESCRIPTION

Figure 1:
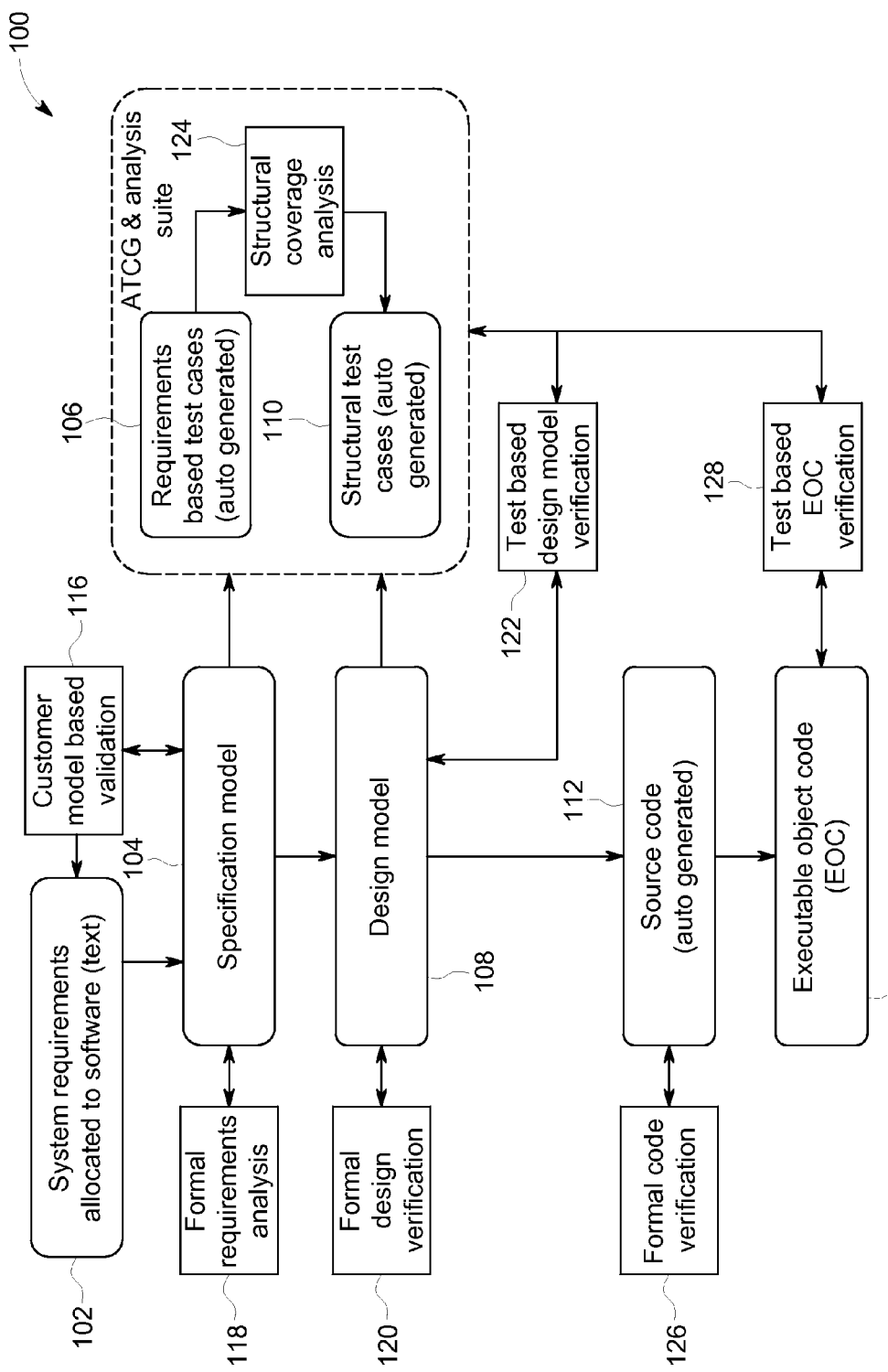
FIG. 1 illustrates a system according to some embodiments.

Developing a system with software and hardware components often involves system requirements provided by a customer. These requirements may be incorporated or captured in a specification model in a computer-readable form. The requirements may also be captured in the specification model in a human-readable form. Then a design model may be developed from the requirements contained in the specification model, and may express software design data (e.g., prescribed software component internal data structures, data flow, and/or control flow). Source code may then be generated automatically from the design model using a qualified code generator.

Often, many errors in software and hardware components are introduced early (e.g., during requirement capture phases) but may not be discovered until later in the component design and creation process. Typically, errors may be difficult to determine early in the process as the requirements may be abstract and may only become more clear as the system is built (e.g, the final software or hardware component is generated). Typically, the larger the distance between error introduction and error discovery, the larger the cost associated with fixing the error.

In one or more embodiments, requirements, such as those included in a specification model, may be formally analyzed using theorem proving. In some embodiments, where the analyses generate conjectures that are not theorems, a counter-example may be automatically generated to illustrate where and how the requirement fails to satisfy some analysis.

In one or more embodiments the requirements are described using a formal notation (e.g., the notation has a precise, mathematically defined syntax and semantics.) Examples of formal notation include, but are not limited to, modeling languages, first order logic, set theory, higher-order logic, programming languages, and structured natural language.

In one or more embodiments, the requirements may be verified and validated in an incremental way, where requirements may be checked incrementally and dynamically (e.g., as soon as individual requirements are formalized/written).

In one or more embodiments, the verification and validation strategies may be integrated into a requirements capture tool, for example, such that the verification and validation of the requirements occurs automatically as soon as a user updates the requirements, without the need for a user to explicitly initiate the verification and validation analysis.

In one or more embodiments, the verification and validation strategies may be used to analyze the requirements without needing to access executable object code, lower-level requirements or higher-level requirements.

Some embodiments apply a series of modules executing verification and validations strategies to the requirements in a particular order. The series of modules may find errors at the earliest possible point in time (e.g., as soon as requirements are written).

In one or more embodiments, the application of the modules may be ordered such that simpler analyses are performed before more complex analyses. Simpler analyses may be performed more quickly than complex analyses and may find obvious, egregious errors that may be easier to correct.

In one more embodiments, the application of the modules may be ordered such that if performing analysis A can help simplify analysis B, then analysis A may come before analysis B.

In one or more embodiments, an analysis performed by a module may be simplified because the preceding analysis has already been performed.

In some embodiments, the modules are applied to incomplete requirements (e.g., the requirements are not completely written).

In one or more embodiments, the modules are applied continually to the requirements such that notification of the verification/validation status of the requirement may be provided in real time.

In one or more embodiments, checking the satisfiability of formulas may be performed by a complete decision procedure (e.g., module returns "satisfactory" or "unsatisfactory") or a partial decision procedure (e.g., module may return "?" for incomplete). Incomplete decision procedures may arise, for example, because the underlying logic may be undecidable or the problem may be intractable (e.g., the computational complexity of the decision procedure is more than an available resource (e.g., time, space)).

FIG. 1 is an example of a software development system 100, according to some embodiments. The system 100 may include system requirements 102, a specification model 104, a requirements based automated test case generation module 106, a design model 108, a structural test case module 110, a source code module 112, and an executable object code module 114. As used herein, "system requirements" and "requirements" will be used interchangeably.

In some embodiments, a text version of system requirements 102 to be allocated to software and hardware are acquired. From these requirements 102, the specification model 104 is developed. In one or more embodiments, the specification model 104 may be developed using a combination of semantic modeling and graphical modeling technologies. Other suitable specification model development technologies may be used. In one or more embodiments, the specification model 104 may be validated with the customer via a customer validation module 116. In some embodiments the specification model 104 may be formally analyzed and verified for correctness and consistency with a formal requirements analysis module 118 using automated theorem proving, as will be described further below. Other suitable means of analysis and verification may be used. The formal requirements analysis module 118 may identify errors in requirements early in the software development process, which may significantly reduce late software development cycle rework, thereby saving time and money.

After the specification model 104 is approved by the customer validation module 116 and the formal requirements analysis module 118, the specification model 104 may be passed as an input to a model based design team to create a design model 108. The design model 108 may be formally verified using a formal design verification module 120, which may include some of the same methods in the formal requirements analysis module 118.

In some embodiments, the specification model 104 may be used as an input to the requirements based automated test case generation module 106. Test cases and procedures may be automatically generated by the test case module 106 and may then be applied to the design model 108 via a model based verification module 122 and analyzed for correct functionality. The test cases generated with the test case module 106 may be applied to the design model 108 and analyzed for structural coverage with a structural coverage analysis module 124. The requirements based automated test case generation module 106 may include some of the methods in the formal requirements analysis module 118.

The source code module 112 may create source code from the design model 108. The source code may be formally analyzed with a formal code verification module 126 using static analysis methods, for example. Other suitable analyses may be used. The executable object code module 114 may compile the source code. A test based executable object code verification module 128 may then verify the executable object code reusing the test cases developed in the test case module 106.

Figure 2A:
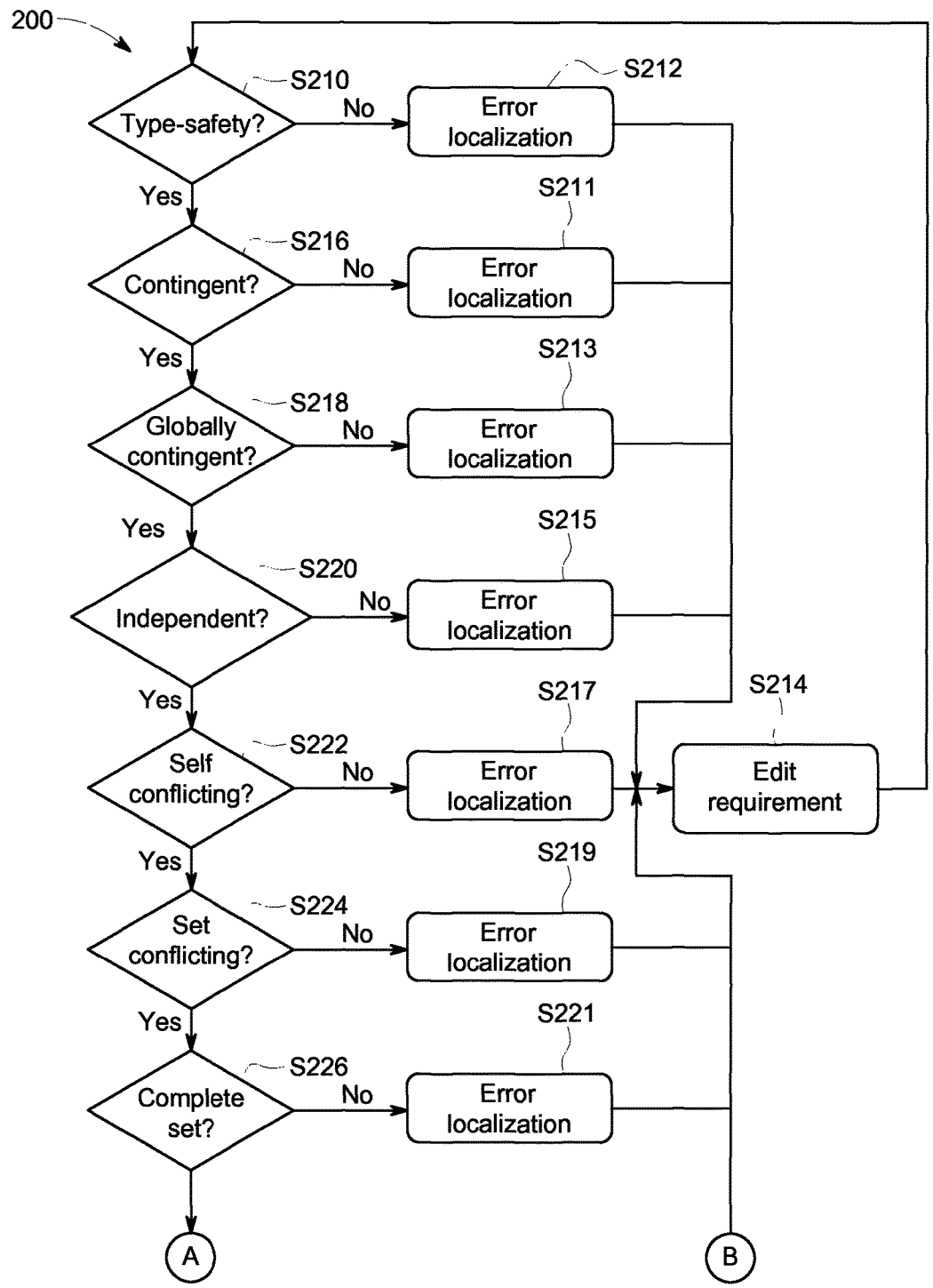
FIGS. 2A and 2B illustrates a flow diagram according to some embodiments.
Figure 2B:
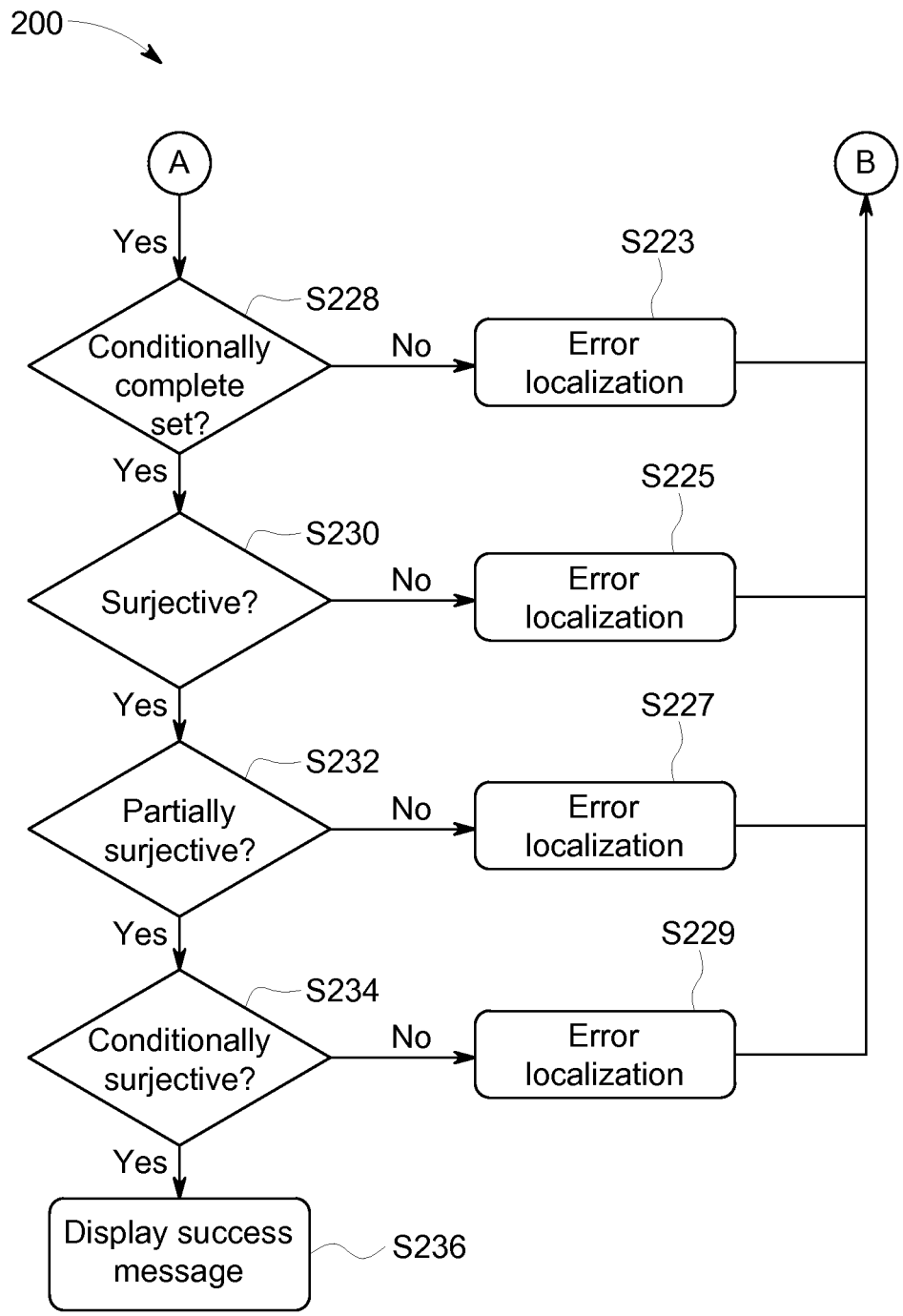

Turning to FIGS. 2-6, in one example operation according to some embodiments, FIGS. 2A and 2B are a flow diagram of a process 200. Process 200 and other processes described herein may be performed using any suitable combination of hardware (e.g., circuit(s)), software or manual means. In one or more embodiments, the system 100 is conditioned to perform the process 200 such that the system 100 is a special purpose element configured to perform operations not performable by a general purpose computer or device. Software embodying these processes may be stored by any non-transitory tangible medium including a fixed disk, a floppy disk, a CD, a DVD, a Flash drive, or a magnetic tape. Examples of these processes will be described below with respect to the elements of the system 100, but embodiments are not limited thereto.

As described above, embodiments apply a series of modules executing strategies in a particular order. For example, as described further below, process 200 includes the execution of verification and validation strategies to the requirements, via a series of modules, in a particular order. The order provided in one or more embodiments is advantageous in that simpler analyses are performed before more complex analyses. Simpler analyses may be performed more quickly than complex analyses and may find obvious, egregious errors that may be corrected earlier.

Figure 3:
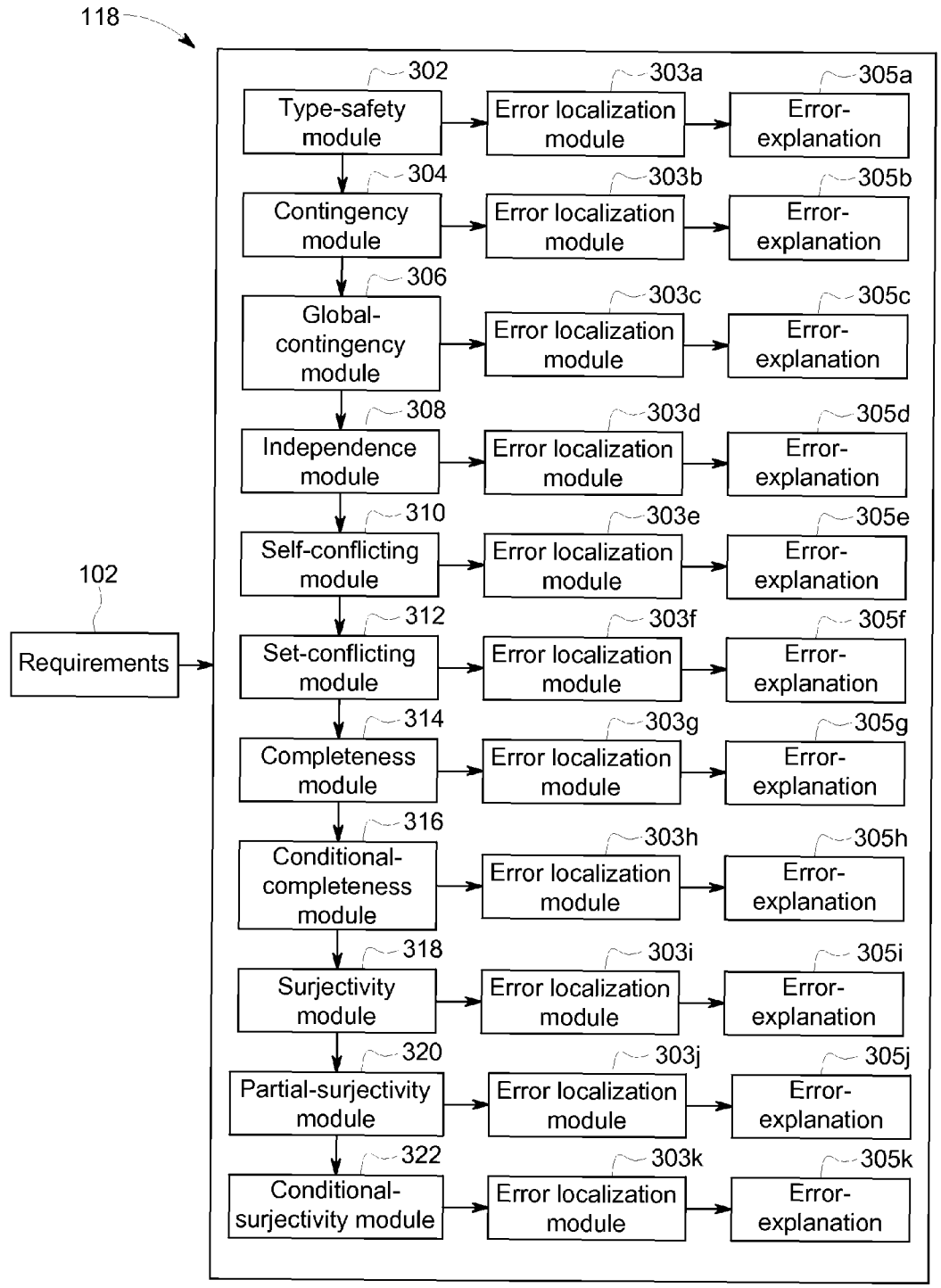
FIG. 3 illustrates a block diagram of a system according to some embodiments.

While the process 200 and associated modules will be described in more detail below, the process 200 initially receives the requirements at a type-safety module 302 (FIG. 3). In one or more embodiments, a communication device 720 (FIG. 7) communicates with a user to obtain one or more requirements associated with a specification model 104 or other model. The type safety module 302 determines whether the requirements are type-safe in S210. If the requirements are not type-safe, the process 200 proceeds to S212, and an error message is generated by the type-safety module 302 and an error explanation 305a may be generated via the error-localization module 303a and displayed. The error explanation module 303a may include a counter-example. While an error localization module 303a-k is shown in FIG. 3, such that each module includes an individual/module specific error localization module 303a-k, in other embodiments, a single error localization module may be shared by all of the modules. In one or more embodiments, each error localization module may include a method specific for the analysis being performed by the analysis module. Then the requirements are edited and revised in S214 to address the type-safe error. In one or more embodiments, the editing and revision of requirements, in this step and throughout the specification, may be by a software engineer or any other suitable element able to address the error. After the requirements are updated (e.g., edited/revised) the process 200 returns to S210, and the type-safety module 302 receives the updated requirements. The process 200 is iterative until the type-safety module 302 determines the requirements are type-safe.

If in S210 the type-safety module 302 determines the requirements are type-safe, the process 200 continues to S216, and the requirements are received at a contingency module 304 (FIG. 3). The contingency module 304 determines whether the requirements are contingent (i.e., a requirement that is both satisfiable and falsifiable) in S216. If the requirements are not contingent, the process 200 proceeds to S211, and an error message is generated by the contingency module 304 and an error explanation 305b may be generated by the error-localization module 303b and displayed. The error explanation may include a counter-example. Then the requirements are edited and revised in S214 to address the contingency error. After the requirements are updated (e.g., edited/revised) the process 200 returns to S210, and the type-safety module 302 receives the updated requirements. The type-safety module 302 and then the contingency module 304 are applied to the updated requirements, as described above. The process 200 is iterative until the contingency module 304 determines the requirements are contingent.

If in S216 the contingency module 304 determines the requirements are contingent, the process 200 continues to S218, and the requirements are received at a global-contingency module 306 (FIG. 3). The global-contingency module 306 determines whether the requirements are globally contingent (i.e., the conjunction of all requirements is contingent) in S218. If the requirements are not globally contingent, the process 200 proceeds to S213, and an error message is generated by the global-contingency module 306 identifying a minimal set of requirements that are not globally contingent and an error explanation 305c is generated by the error localization module 303c and displayed. The error explanation 305c may include a counter-example. Then the requirements are edited and revised in S214 to address the global-contingency error. After the requirements are updated (e.g., edited/revised) the process 200 returns to S210, and the type-safety module 302 receives the changed requirements. The type-safety module 302, then the contingency module 304, and then the global-contingency module 306 are applied to the updated requirements, as described above. The process 200 is iterative until the global-contingency module 306 determines the requirements are globally contingent.

If in S218 the global-contingency module 306 determines the requirements are globally contingent, the process 200 continues to S220, and the requirements are received at an independence module 308 (FIG. 3). The independence module 308 determines whether the requirements are independent (e.g., each requirement is independent (not-implied) of other requirements) in S220. If the requirements are not independent, the process 200 proceeds to S215, and an error message is generated by the independence module 308 and an error explanation 305d is generated by the error localization module 303d, whereby a requirement which is not independent is identified along with a minimal set of requirements on which it depends and displayed. Then the requirements are edited and revised in S214 to address the independence error. After the requirements are updated (e.g., edited/revised) the process 200 returns to S210, and the type-safety module 302 receives the changed requirements. The type-safety module 302, then the contingency module 304, then the global-contingency module 306, and then the independence module 308 are applied to the updated requirements, as described above. The process 200 is iterative until the independence module 308 determines the requirements are independent.

If the independence module 308 determines in S220 the requirements are independent, the process 200 continues to S222, and the requirements are received at a self-conflicting module 310 (FIG. 3). The self-conflicting module 310 determines whether each requirement is self-conflicting (i.e., if there is some input value of a monitored variable for which the requirement cannot be satisfied, no matter what value is given to the controlled variables). If the requirements are self-conflicting, the process 200 proceeds to S217, and an error message is generated by the self-conflicting module 310 and an error explanation 305e is generated by the error-localization module 303e and displayed. The error explanation 305e may include a counter-example. Then the requirements are edited and revised in S214 to address the self-conflicting error. After the requirements are updated (e.g., edited/revised) the process 200 returns to S210, and the type-safety module 302 receives the changed requirements. The type-safety module 302, then the contingency module 304, then the global-contingency module 306, then the independence module 308, and then the self-conflicting module 310 are applied to the updated requirements, as described above. The process 200 is iterative until the self-conflicting module 310 determines the requirements are not self-conflicting.

If the self-conflicting module 310 determines in S222 the requirements are not self-conflicting, the process 200 continues to S224, and the requirements are received at a set-conflicting module 312 (FIG. 3). The set-conflicting module 312 determines whether the set of requirements is conflicting (e.g., there is some input value of the monitored variables for which the set of requirements cannot be satisfied, not matter what value is given to the controlled variables.) If the requirements are set-conflicting, the process 200 proceeds to S219, and an error message is generated by the set-conflicting module 312 and a minimal set of conflicting requirements is identified and an error explanation 305f, which may include a counter-example, is generated by the error localization module 303f and displayed. Then the requirements are edited and revised in S214 to address the set-conflicting error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310 and then the set-conflicting module 312 are applied to the updated requirements, as described above. The process 200 is iterative until the set-conflicting module 312 determines the requirements are not set-conflicting.

If the set-conflicting module 312 determines the requirements are not set-conflicting, the process 200 continues to S226, and the requirements are received at a completeness module 314 (FIG. 3). The completeness module 314 determines whether the set of requirements is complete (a set of requirements is complete with respect to a set of controlled variables if the requirements uniquely specify the value of every given controlled variable, given concrete values for the monitored variables.) If the set of requirements are not complete, the process 200 proceeds to S221, and an error message is generated by the completeness module 314 and an error explanation 305g including a minimal set of controller variables and requirements is identified, along with a counter-example that includes two possible values for a controlled variable is generated by the error localization module 303g and displayed. Then the requirements are edited and revised in S214 to address the incomplete set error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310, then the set-conflicting module 312, and then the completeness module 314 are applied to the updated requirements, as described above. The process 200 is iterative until the completeness module 314 determines the requirements are complete.

If the completeness module 314 determines the requirements are complete, the process continues to S228, and the requirements are received at a conditionally completeness module 316 (FIG. 3). The conditionally completeness module 316 determines whether the set of requirements is conditionally complete (a set of requirements is conditionally complete with respect to a set of controlled variables and a condition if the requirements are complete under the assumption that the condition holds, where a condition is a formula whose free variables are a subset of the monitored variables appearing in the requirements.) If the set of requirements is not conditionally complete, the process 200 proceeds to S223, and an error message is generated by the conditional-completeness module 316 and an error explanation 303h including identification of a minimal set of controller variables and requirements, along with a counter-example that includes two possible values for a controlled variable is generated by the error localization module 303h and displayed. Then the requirements are edited and revised in S214 to address the conditionally incomplete set error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310, then the set-conflicting module 312, then the completeness module 314, and then the conditionally completeness module 316 are applied to the updated requirements, as described above. The process 200 is iterative until the conditional-completeness module 316 determines the requirements are conditionally complete.

If the conditional-completeness module 316 determines the requirements are conditionally complete, the process continues to S230, and the requirements are received at a surjectivity module 318 (FIG. 3). The surjectivity module 318 determines whether the requirements are surjective (a controlled variable, c, is surjective with respect to a set of requirements, R, if for every value, v, in c's type, there is some system state for which c gets assigned v.) If the set of requirements are not surjective, the process 200 proceeds to S225, and an error message is generated by the surjectivity module 318 and an error explanation 305 including a counter-example is generated by the error localization module 303i that identifies a value for the controlled variable so that no matter what system state we start out in, there is no way to assign this value to the controlled variable and displayed. Then the requirements are edited and revised in S214 to address the surjective error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310, then the set-conflicting module 312, then the completeness module 314, then the conditional-completeness module 316, then the surjectivity module 318 are applied to the updated requirements, as described above. The process 200 is iterative until the surjectivity module 318 determines the requirements are surjective.

If the surjectivity module 318 determines the requirements are surjective, the process continues to S232, and the requirements are received at a limited or partial-surjectivity module 320 (FIG. 3). The partial-surjectivity module 320 determines whether the requirements are partially surjective (a controlled variable, c, is partially surjective with respect to a set of requirements, R, and a set of values, V, if for every value v∈V, there is some system state for which c gets assigned v.) If the set of requirements is not partially surjective, the process 200 proceeds to S227, and an error message is generated by the partial-surjectivity module 320 and an error explanation 305j including a counter-example is generated by the error localization module 303j that identifies a value in V for the controlled variable so that no matter what system state we start out in, there is no way to assign this value to the controlled variable and displayed. Then the requirements are edited and revised in S214 to address the partially surjective error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310, then the set-conflicting module 312, then the completeness module 314, then the conditional-completeness module 316, then the surjectivity module 318, and then the partial-surjectivity module 320 are applied to the updated requirements, as described above. The process 200 is iterative until the partial-surjectivity module 320 determines the requirements are surjective.

If the partial-surjectivity module 320 determines the requirements are partially surjective, the process continues to S234, and the requirements are received at a mode or conditional-surjectivity module 322 (FIG. 3). The conditional-surjectivity module 322 determines whether the requirements are conditionally surjective (e.g., a controlled variable, c, is conditionally surjective with respect to a set of requirements, R, a set of values, V, and a condition $\phi$ if under the assumption that $\phi$ holds, for every value v∈V, there is some system state for which c gets assigned v). If the set of requirements is not conditionally surjective, the process 200 proceeds to S229, and an error message is generated by the conditional-surjectivity module 322 and an error explanation 305k including a counter-example is generated by the error localization module 303k that identifies a value in V for the controlled variable so that no matter what system state we start out in, if the system state satisfies there is no way to assign this value to the controlled variable and displayed. Then the requirements are edited and revised in S214 to address the conditionally surjective error. After the requirements are updated (e.g., edited/revised) the process 200 returns to S210, and the type-safety module 302 receives the updated requirements. The type-safety module 302, then the contingency module 304, then the global-contingency module 306, then the independence module 308, then the self-conflicting module 310, then the set-conflicting module 312, then the completeness module 314, then the conditional-completeness module 316, then the surjectivity module 318, then the partial-surjectivity module 320, and then the conditional-surjectivity module 322 are applied to the updated requirements, as described above. The process 200 is iterative until the conditional-surjectivity module 322 determines the requirements are surjective.

If the conditional-surjectivity module 322 determines the requirements are conditionally surjective, the process 200 proceeds to S236, and a message is displayed on a user interface indicating the requirements are verified and validated as the requirements have successfully passed through all of the modules. After the specification model 104 including the requirements is verified and validated by the requirements analysis module 118, for use in software design, the specification model 104 may be passed as an input to a model based design team to create the design model 108.

Turning to FIG. 3, a more detailed description of the modules included in the requirements analysis module 118 is provided.

The type-safety module 302, associated with S210, may analyze the requirements to determine that all expressions used to formalize the requirements are well typed, as specified by semantic typing rules. This analysis may catch errors such as assigning a single float to a double, a variable that is in units of mph (miles/hr) to one in kph (km/hr), etc. In one or more embodiments, after identification of a type-safe error by the type-safety module 302, the error localization module 303a may isolate errors by highlighting the type violations in the requirements and may provide an error explanation 305a including a counter-example. Type-safety analysis performed by the type-safety module 302 may depend on the type of framework or formalization used to represent requirements.

In one or more embodiments, the requirements may include variables and components and modules, and type-safety analyses may be performed on variables, components and modules encoded with type information. In one or more embodiments the type information may be semantic. For example, if variables x and y store integers, but x is intended to hold values of unit α and γ is intended to hold values of unit β, then x and y should be of different types. Having different types may facilitate the discovery of errors, such as adding x and y, during type-safety analysis. Additionally, the types of x and y may be ranges that include only the feasible values of that type (e.g., if x is meant to denote the number of passengers that could simultaneously be located on a vehicle, then the type of x should be the set of non-negative integers up to the maximum capacity of the vehicle). Of note, by specifying types in this way, it may be possible to find errors in requirements that are difficult to find otherwise. In one or more embodiments, the type of various variables may be stated as part of the requirements.

After semantic types are defined, functions over those types may be defined as part of the requirements. In one or more embodiments, these functions may be defined using a requirements specification formalism, which may be done in an abstract way and then refined via a sequence of refinement steps until an actual implementation is developed. In one or more embodiments, the controlled variables (output variables) may be functions of the monitored variables (input variables). In one or more embodiments functions satisfy the rule of Leibniz: $\vec{x}=\vec{y}$ then $f(\vec{x})=f(\vec{y})$, i.e., the return value of f depends only on the arguments to f. Of note, defining the requirements with functions may have the advantage that all dependencies of a function, component, or module are explicitly identified, which may facilitate analysis and error identification.

The contingency module 304, associated with S216, may analyze each requirement to determine whether the requirement, on its own is contingent. As described above, a requirement is contingent if it is both satisfiable and falsifiable. In one or more embodiments, a requirement that is not satisfiable may not be implemented. In one or more embodiments, a requirement that is not falsifiable is always true (i.e, it does not place any constrains on the behavior of the system) and therefore may not add any value to the system. In one or more embodiments, the contingency module 304 first analyzes the requirement to determine whether the requirement r is satisfiable. If r is unsatisfiable, then r is not contingent, and this status may be reported to a user by the contingency module 304. In one or more embodiments, the status may be displayed on a user interface, as further described below. Then the contingency module 304 analyzes the requirement to determine whether ¬r is satisfiable, e.g. whether r is falsifiable. If both r and ¬r are satisfiable, then r is contingent, and this status may be reported to a user by the contingency module 304.

In one or more embodiments, requirements that are not contingent correspond to errors. In one or more embodiments, the error localization module 303b may identify and report which test (satisfiable, falsifiable) failed. In one or more embodiments, if an outcome of one of the contingency tests cannot be determined, an error may be reported to the user by the error localization module 303b, and may include which test has an indeterminate outcome.

The global-contingency module 306, associated with S218, may analyze all of the requirements to determine whether the conjunction of all requirements is contingent. Note that as each of the requirements has already been individually checked for contingency via the contingency module 304, the global-contingency analysis may be simplified. As described above, a set of requirements is contingent if the conjunction of the requirements is contingent (satisfiable and falsifiable). In one or more embodiments, if the set of requirements is not satisfiable, the requirements may not be consistent and then may not be implemented. In one or more embodiments if the set of requirements is not falsifiable, the set may not place any constrains on the behavior of the system and then may be unnecessary. As used herein, R is the set of all requirements, and the notation $\hat{R}$ denotes the conjunction of requirements in the set R. Given that the contingency module 304 has already been applied to each requirement individually such that each requirement is contingent when it is received at the global-contingency module 306, it follows from propositional reasoning that $\hat{R}$ is falsifiable. As such, in one or more embodiments, a check of the falsifiability of $\hat{R}$ may be avoided to save costs, and to check the contingency of $\hat{R}$, in one or more embodiments the global-contingency module 306 may only check that $\hat{R}$ is satisfiable.

In one or more embodiments, there may be at least two instances where the contingency of R may not be determined. In the first instance, the satisfiability of R may be unknown, and this status may be reported to the user by the global-contingency module 306. In one or more embodiments, if the satisfiability status is unknown, a user may perform at least one of: increase the timeout of the satisfiability test, if that is the issue; restrict the analysis to a subset of the requirements; use any other suitable standard method for reducing the complexity of checking the satisfiability of R.

In the second instance, if R is unsatisfiable, the error localization module 303c may then identify an unsatisfiable core of requirements. In one or more embodiments, the unsatisfiable core of requirements may be a subset of the requirements, S, that satisfies two properties: 1. The conjunction of requirements in S is unsatisfiable, and 2. Every proper subset of S is satisfiable.

In one or more embodiments, to determine the unsatisfiable core of requirements, the error localization module 303c may initially set S to be the list of all requirements, and then the core C may be initialized to be the empty list. The error localization module 303c may then check the elements of S. During each check, the error localization module 303c may determine whether the conjunction of the REST of S (all elements besides the first) and C is not unsatisfiable. If so, then the FIRST element of S is added to C. In one or more embodiments, if the error localization module 303 returns a value of satisfiable, then FIRST is part of an unsatisfiable core. However, if the error localization module 303c cannot determine satisfiability then FIRST may or may not be part of the unsatisfiable core. In these instances, FIRST (5) may also be added to C. If the error localization module 303c returns unsatisfiable, then FIRST (S) may be removed from S, and the process continues with each requirement to determine the unsatisfiable core of requirements.

In one or more embodiments, an unsatisfiable core of requirements may be smaller than the set of all requirements (e.g., there may be thousands of requirements, but an unsatisfiable core of requirements may include only a handful of requirements).

In one or more embodiments determining a core of unsatisfiable requirements may use a linear number of satisfiability queries. In one or more embodiments, the call to determine a core of unsatisfiable requirements may only include requirements that contributed to the unsatisfiable core.

The independence analysis module 308, associated with S220, may analyze the requirements to determine that a set of requirements is independent. As described above, a requirement, r, is independent of a set of requirements R if it is not implied by the other requirements. If the requirement is implied by the set of requirements, then the requirement is dependent on R. In one or more embodiments, if a requirement is dependent, the requirement may be erroneous and need to be fixed, or the requirement may be redundant. In one or more embodiments, if the independence analysis module 308 determines a requirement is redundant, the error localization module 303d may generate a dependent core (e.g., a minimal subset of requirements which are not independent) and may report the dependent core to the user. In one or more embodiments, the user may revise or delete the requirement to remove the redundancy, as if the redundancy were left in the specification, it may lead to redundant work downstream, including redundant verification and validation work. In one or more embodiments, the independence analysis module 308 may analyze the reason why there was a redundancy to determine if there is a systemic process issue.

In one or more embodiments, there are two instances where the independence analysis module 308 may not determine that a requirement, $R_i$, is independent of $R^i$, where $R^i$ denotes the set of all requirements except for requirement $R_i$. The first instance may be that the independence analysis module 308 may not be able to determine the independence, and a report is generated by the independence analysis module 308 for the user indicating that the independence of $R_i$ is unknown. In the second instance, if the independence analysis module 308 determines the requirement is not independent (e.g., is dependent), a dependent core is determined by the error localization module 303d and reported to the user. In one or more embodiments, the dependent core may be a subset of the requirements, S, that satisfies the following requirements: 1. S is a subset of all the requirements and does not contain requirement $R_i$, and 2. The requirement, $R_i$, is dependent on S, and 3. $R_i$ is independent of every proper subset of S.

In one or more embodiments, the error localization module 303d may determine the dependent core of requirements. In some embodiments, the dependent core of requirements may be significantly smaller than the set of all requirements (e.g., there may be thousands of requirements, but a dependent core may include a handful (e.g., less than or equal to a dozen) of requirements). The determination of the dependent core of requirements may indicate to the user the cause of the independence failure and how to correct it. For this determination, S may initially be the list of all requirements in except requirement $R_i$ and r is initially $R_i$. In one or more embodiments, the error localization module 303d may only include requirements that contributed to the dependence determination in the determination of the dependent core of requirements.

The self-conflicting module 310, associated with S222, may analyze the requirements to determine whether a requirement is self-conflicting. As described above, a requirement is self-conflicting if there is some input value for the monitored variables from which the requirement cannot be satisfied, no matter what value is given to the controlled variables. In one or more embodiments, if a requirement is self-conflicting then the requirement implies that some values of the monitored variables are not allowed. However, requirements may not be allowed to restrict the domain of the monitored variables, and therefore a determination that a requirement is self-conflicting results in the self-conflicting module 310 generating a report to a user indicating a self-conflict exists and the error localization module 303e identifying the self-conflicting requirement.

For example, consider the requirement: if Accelerate-Mode is ON then DesiredSpeed shall be set to a value greater than CurrentSpeed. If CurrentSpeed and DesiredSpeed are of the same type, say they are integers in the range [0 . . . 400], and if the monitored variable CurrentSpeed=400, then there is no way to assign the controlled variable DesiredSpeed a value so that the requirement is satisfied. In this example, the characterization of the feasible values of the variables allowed for the determination of the conflict (e.g., if type of variables had just been specified to be an integer, then the requirement would not be self-conflicting because there is no largest integer).

In one or more embodiments where the standard logical symbols are:
¬ : negation symbol (not)
∨ : disjunction symbol (or)
∧ : conjunction symbol (and)
⇒ : implication symbol (implies)
☐ : bi-implication symbol (iff)
=: equality symbol (equals)
∀: universal quantification symbol (for all)
∃: existential quantification symbol (there exists)
⟨$Qx_1, \ldots, x_n$:r:b⟩ denotes a quantified expression where:
1. Q, the quantifier, is either ∀ or ∃;
2. $x_1, \ldots, x_n$ are the bound variables;
3. r is the range (true if omitted); and
4. b the body.
⟨∀:r:b⟩ is equivalent to ⇒ ∀x::r∧ b⟩ and ⟨∃x:r:b⟩ is equivalent to ⟨∃x::r^b).

In one or more embodiments, the self-conflicting analysis module 310 may formalize the self-conflicting check as:

$$\langle \forall m_1, \ldots, m_n : m_1 \in T_1 \char`\^ \ldots \char`\^ m_n \in T_n : \langle \exists c_1, \ldots, c_k : c_1 \in Z_1 \char`\^ \ldots \char`\^ c_k \in Z_k : r(m_1, \ldots, m_n, c_1, \ldots, c_k) \rangle \rangle \quad (1)$$

where r is the requirement being analyzed, $m_1, \ldots m_n$ are the monitored variables of the requirement, $T_1, \ldots, T_n$ are the types of the monitored variables, $c_1, \ldots, c_k$ are the controlled variables of the requirement, and $Z_1, \ldots, Z_k$ are the types of the controlled variables. Formula 1 states that for any feasible assignment of values to the monitored variables (recall that the types of the monitored variables correspond to their feasible values), there is at least one assignment of feasible values to the controlled variables such that requirement r holds.

In one or more embodiments, to determine whether Formula 1 is valid, the self-conflicting analysis module 310 determines whether the requirement satisfies the following (the negation of the equation):

$$\langle \exists m_1, \ldots, m_n : m_1 \in T_1 \wedge \ldots \wedge m_n \in T_n : \\ \langle \forall c_1, \ldots, c_k : c_1 \in Z_1 \wedge \ldots \wedge c_k \in Z_k : \\ \neg r(m_1, \ldots, m_n, c_1, \ldots, c_k) \rangle \rangle \quad (2)$$

If the requirement satisfies Formula 2, then there is an assignment to the monitored variables $m_1, \ldots m_n$ which may provide a concrete system state exhibiting a self-conflict. If the requirement does not satisfy Formula 2, then Formula 1 is invalid (e.g., requirement r is not self-conflicting).

In one or more embodiments, to determine whether a requirement self-conflicts, the self-conflicting module 310 may apply a decision procedure to the requirement. The self-conflicting module 310 may first determine whether the requirements contain any quantifiers or function symbols. If the requirement does not contain any quantifiers or function symbols, then a decision procedure may be used to determine whether the requirement self-conflicts. In one or more embodiments, for example, Formula 1, described above, is constructed by extracting the monitored and controlled variables appearing in r, (e.g., $m_1, \ldots m_n$ and $c_1, \ldots, c_k$, respectively, and their types $T_1, \ldots, T_n$ and $Z_1, \ldots, Z_k$) and then executes the decision procedure and returns the result, depending on whether the requirement self-conflicts per the executed formula.

In one or more embodiments, to determine whether a requirement self-conflicts, the self-conflicting module 310 may first determine a finite type associated with each controlled variable. The self-conflicting module 310, in some embodiments, may select a set of variables that includes all the controlled variables, and for each selected variable z of type Z to associate a finite set V such that $V \subseteq Z$. In one or more embodiments the self-conflicting module 310 may determine the association in one of several ways. For example:

1. If $|Z| < \omega$ then V=Z (where $\omega$ denotes the cardinality of the set of natural numbers, i.e., it is the first infinite ordinal).

2. For each type Z, an association of a finite subtype of a specified size is determined by selecting elements of S using a random process.

3. If type Z is a set of numbers ranging from l to h, a finite subtype of size n>1 may be defined by dividing the range into n−1 equally sized segments and then selecting numbers at the borders of the segments. For example, numbers may be selected as:

$$l, l+\frac{h-l}{n-1}, l+2\frac{h-l}{n-1}, \ldots, h.$$

4. For each type Z perform an analysis to determine a finite subset based on historical information, e.g., by considering values for which testing found errors in the past.

5. For each type construct a finite set of values based on subject matter expertise.

6. For each type perform an equivalence-class analysis to partition the type into equivalence classes and then select some number of representatives from each equivalence class. In one or more embodiments, equivalence-class analysis may include one of robustness analysis, normal case analysis, and any other suitable analysis.

7. Any finite number of strategies may be used to construct a sequence of subtypes $V_1, V_2, \ldots V_k$ which may then be combined in some way (e.g., by taking their union).

In one more embodiments, each of the above strategies 1-7 may be applied to types or to individual variables. For example, two variables of the same type may have different finite subtypes associated with them. While the examples herein assume that only controlled variables are associated with finite sets, finite sets may be associated with monitored variables, in one or more embodiments.

After the self-conflicting module 310 associates finite types with each controlled variable, the module 310 may take as input the requirement r, the list of monitored variables in the requirement, the list of the types of the monitored variables in the requirement, the list of controlled variables in the requirement, the types of the controlled variables in the requirement, and the associated finite types. In one or more embodiments, the association between controlled variables and finite types may allow the removal of the universal quantifiers from Formula 2, yielding:

$$\langle \exists m_1, \ldots , \quad (3) \\ m_n : m_1 \in T_1 \bigwedge \ldots \bigwedge m_n \in T_n : \bigwedge_{\sigma \in \{(c_1 \leftarrow v_1, \ldots, c_k \leftarrow v_k) | v_1 \in V_1 \wedge \ldots \wedge v_k \in V_k\}} \\ \neg r(m_1, \ldots, m_n, c_1, \ldots, c_k)\big|_\sigma \rangle$$

where the notation $\phi/\sigma$ denotes the application of substitution $\sigma$ to formula $\phi$, where a substitution is a mapping from variables to values.

In one or more embodiments, an assignment that satisfies Formula 3 may not necessarily satisfy Formula 2. As such, if the requirement is not self-conflicting using Formula 3, the implication is that there is no conflict using Formula 2; but if there's a conflict using Formula 3, that may not necessary imply there is a conflict using Formula 2. As such, the self-conflicting module 310 determines whether Formula 3 holds for a requirement. In one or more embodiments, to determine whether Formula 3 holds for a requirement, the self-conflicting module 310 applies Formula 4, below, to the requirement. In one or more embodiments, Formula 4 is Formula 3 with all of the parameters made explicit.

$$\Phi_4(r, \overrightarrow{m_{1\ldots n}}, \overrightarrow{T_{1\ldots n}}, \overrightarrow{c_{1\ldots k}}, \overrightarrow{Z_{1\ldots k}}, \overrightarrow{V_{1\ldots k}}) = \quad (4) \\ \left[ \begin{array}{c} m_1 \in T_1 \wedge \ldots \wedge m_n \in T_n \wedge c_1 \in Z_1 \wedge \ldots \wedge c_k \in Z_k \wedge \\ \bigwedge_{\sigma \in \{(c_1 \leftarrow v_1, \ldots, c_k \leftarrow v_k) | v_1 \in V_1 \wedge \ldots \wedge v_k \in V_k\}} \neg r(m_1, \ldots, m_n, c_1, \ldots, c_k)\big|_\sigma \end{array} \right]$$

As used herein, vector notation may denote lists, e.g. $\overrightarrow{m_{1\ldots n}}$ denotes $m_1, \ldots, m_n$.

In one or more embodiments, the application of Formula 4 may result in an output that the requirement is not self-conflicting or that it could not be determined that the requirement was self-conflicting. In one or more embodiments, this output is reported to the user.

In one or more embodiments if the self-conflicting analysis module 310 determines via application of Equation 4 that the requirement is self-conflicting, the module 310 may further apply an additional test to determine whether the requirement is truly self-conflicting. For example, the module 310 may instantiate the monitored variables in Formula 1, and solve the formula. The error localization module 303e may then return the requirement that self-conflicts.

In one or more embodiments, after the self-conflicting module 310 determines a requirement is not self-conflicting, it may create a better finite approximation of the types, which may increase the precision of the analysis.

The set-conflicting module 312, associated with S224, may analyze the set of requirements to determine whether they are conflicting. As described above, a set of requirements is conflicting if there is some input value of the monitored variables for which the set of requirements cannot be satisfied, no matter what value is given to the controlled variables. In one or more embodiments, if the set of requirements is conflicting, then the set of requirements may imply that some values of the monitored variables are not allowed. However, requirements may not be allowed to restrict the domain of the monitored variables, such that if the set-conflicting module 312 determines a set of requirements conflicts, a report indicating the conflict is generated for the user. An example of two conflicting requirements is:

If ExternalTemperature is less than or equal to TemperatureLow then Temperature Warning shall be set to On.

If TemperatureWarningMode is Off then Temperature Warning shall be set to Off.

In the case where ExternalTemperature is less than TemperatureLow and TemperatureWarningMode is Off, then the first requirement implies that Temperature Warning shall be set to On, but the second requirement implies that it shall be set to Off. This is a conflict. While in this example two requirements participated in the set-conflict, a conflict may depend on any number of requirements.

In one or more embodiments, the set-conflicting module 312 may apply Formula 1 to the requirements, replacing the single requirement r with the conjunction of requirements R.

In one or more embodiments, if the set-conflicting module 312 determines a set of requirements includes a conflict, the error localization module 303 may identify those requirements involved in the conflict, by extracting a conflict core. In one or more embodiments, the error localization module 303 may extract a conflict core given a list of requirements S, an assignment to the monitored variables exhibiting a conflict $(a_1, \ldots, a_n)$, a list of the controlled variables $(c_1, \ldots c_k)$ and a list of the types of the controlled variables $(Z_1, \ldots Z_k)$. Given S, a set of conflicting requirements, a conflict core, say $S^r$, may satisfy all of the following properties:

1. $S^r \subseteq S$
2. $S^r$ contains a conflict
3. No proper subset of $S^r$ contains a conflict In one or more embodiments, the error localization module 303f may begin the conflict core determination by first defining C, the conflict core, to be the empty list and P to be the list of requirements obtained by applying the assignment to all requirements in S. The error localization module 303f may then iterate through the requirements in P and if the particular requirement is needed for the conflict, it may be added to C. In one or more embodiments, whether a requirement is needed for the conflict may be determined by application of Formula 1.

Of note, if a set of requirements does not contain a conflict, it also does not contain a self-conflict. However, performing a self-conflict analysis on the requirements first, as in embodiments of the invention, provides several advantages. One advantage is that self-conflict analysis may be performed as each requirement is defined, without having to wait for all requirements to be ready, allowing errors to be found earlier. Another advantage is that a self-conflict may be easier to understand and fix than a set conflict because a self-conflict only requires understanding one requirement, whereas a set conflict may involve any number of requirements. Another advantage is that self-conflict analysis may be simpler, less complex and therefore more robust than a set-conflict analysis.

Of note, simultaneously checking many (e.g., complex systems may include over a hundred thousand requirements) requirements may be difficult to scale. In one or more embodiments, set-conflict checking may be made more scalable by the set-conflict checking module 312 partitioning the conflict analysis similarly to the partitioning used during system design to decompose the system into components, for example. Partitioning may allow the checking of each component in isolation and to then check interface requirements that specify how components interact. In one or more embodiments, set-conflict checking may also be made more scalable by the set-conflicting module 312 checking for conflicts between pairs of requirements that may share a controlled variable that may conflict with each other, as many conflicts involve a small number of requirements. In other embodiments, checking for conflicts with the set-conflicting module 312 may be extended to sets of requirements whose cardinality is less than some small integer. In some embodiments, set-conflict checking may also be made more scalable by the set-conflicting module 312 performing conflict analysis on a per-variable basis ("variable-based conflict analysis"). In variable-based conflict analysis, the set-conflicting module 312 may select all requirements that can constrain the values a particular variable can take and to only analyze these requirements for a conflict. Since a single requirement can potentially contain more than one variable, requirements may now be involved in several conflict analyses, but each conflict analysis will tend to contain far fewer requirements than the total number of requirements, making analysis more scalable.

In one or more embodiments, to make the set-conflict analysis more scalable, the set-conflicting module 312 may start with a set of requirements R, and determine the controlled variable connected components. In one or more embodiments the connected components may be determined by starting with a set of requirements R, then creating an undirected graph, G, whose nodes are the elements of R and where there is an edge between two requirements if they have at least one controlled variable in common. Then for each component C of H (where H is the set of all connected components, and, as described above, C is a set of nodes, i.e. a set of requirements), any of the preceding conflict analysis may be performed to analyze C to determine a conflict. If a conflict is found, the conflict core may be extracted (since a strict subset of C may be responsible for the conflict). Note that the analysis is performed on the components in H, not on the variables because the connected component determination partitions the variables into equivalence classes and therefore two variables that are in the same class may have the same set of requirements associated with them. Therefore, analyzing over the variables may lead to redundant determinations.

The completeness module 314, associated with S226 may determine if a set of requirements is complete with respect to a set of controlled variables if the requirements uniquely specify the value of every given controlled variable, given concrete values for the monitored variable. In one or more embodiments, completeness may be needed for functional requirements. As used herein, "uniqueness" means that for every feasible assignment to the monitored variables, at least one assignment of values to the controlled variables is allowed and that no more than one assignment to the controlled variables is allowed. By applying the completeness module 314 to the requirements after the set-conflicting module 312, it has already been established that for every value of the monitored variables, there is at least one assignment of values to all of the controlled variables that satisfies the requirement. The completeness module 314 then determines that no more than one assignment is allowed for the controlled variables of interest. In one or more embodiments, controlled variables that have the property that requirements should completely describe their behavior may be referred to as "functionally complete." In one or more embodiments, the completeness module 314 may only be applied to requirements including variables identified as being functionally complete.

In one or more embodiments, to determine completeness, the completeness module 314 may take as input the set of requirements, the list of monitored variables, the types of the monitored variables, the list of functionally complete controlled variables and the types of the controlled variables, in that order. The completeness module 314 may determine the set of requirements is complete or may not be able to determine if the set of requirements is complete, and may generate a report indicating completeness status for the user. The completeness module 314 may determine the set of requirements is not complete (incomplete). If the set of requirements is determined to be incomplete, the completeness module 314 may report this status to the user, and the error localization module 303g may determine and report to the user which set of requirements are incomplete and may provide an assignment to the monitored variables for which there are two different assignments to the functionally complete controlled variables, both of which satisfy the requirements.

In one or more embodiments, the completeness module 314 may apply a similar strategy as the set-conflicting module 312 to make the determination of set completeness more scalable. For example, the completeness module 314 may perform completeness analysis, as described above, on a per-variable basis by collecting together all requirements that can constrain the values of a particular functionally complete controlled variable. Requirements that constrain more than one functionally complete controlled variable may be involved in several completeness analyses, but each individual completeness analysis may contain less requirements than the total number of requirements, making the analysis more scalable. An advantage of making the completeness analysis more scalable is that the completeness results may be simpler to understand.

The conditionally completeness module 316, associated with S228, may determine whether a set of requirements is conditionally complete. In one or more embodiments, a set of requirements is conditionally complete with respect to a set of controlled variables and a condition of the requirements if they are complete for a set of specified modes (i.e., if the requirements are complete under the assumption that the condition holds, where a condition is a formula whose free variables are a subset of the monitored variables appearing in the requirements.) In one or more embodiments, the conditionally complete set analysis module 316 determines, for a given set of requirements, a set of controlled variables, and a condition, whether the requirements are conditionally complete with respect to the controlled variables and the condition.

In one or more embodiments, there may be conditions, such as certain modes of operation, for example, where the values given to controlled variables are irrelevant (e.g., because the controlled variables are not used in these modes). If such conditions are identified, it is a common design practice to not needlessly over-specify the value of these controlled variables in these conditions. If these design practices are used, the conditional-completeness module 316 may indicate that the requirements are complete with respect to the controlled variables, under the appropriate condition. To determine whether the set of requirements is conditionally complete, the conditional-completeness module 316 may receive as input the set of requirements, the list of monitored variables, the types of the monitored variables, the list of functionally complete controlled variables, the types of the controlled variables, and the condition. The conditional-completeness module 316 may then determine whether the set is conditionally complete, whether conditional completeness is indeterminate, or conditional incompleteness and the variables that exhibit incompleteness, and report the status (and incomplete variables, if present) to the user. In one or more embodiments, if conditional incompleteness is determined, the error localization module 303h may generate a report including the reduced set of requirements needed to exhibit the incompleteness, the reduced set of controlled variables needed to exhibit the incompleteness, and the condition.

In one or more embodiments, determining whether the set of requirements is conditionally complete may be made more scalable by the conditionally complete set analysis module 316 generating a set of controlled variable connected components, H. Recall that the set of all controlled variables may be used in generating H and that each component of H is a set of requirements.

The surjectivity module 318, associated with S230, may determine whether a controlled variable, c, is surjective. As used herein, a controlled variable is surjective with respect to a set of requirements, R, if for every value, v, in v's type, there is some system state for which v gets assigned v. In other words, surjectivity means all output values of a controlled variable over an enumerated type are possible. If the controlled variable is not surjective, a requirement error exists or the type of the variable should be updated. In one or more embodiments, the surjectivity module 318 may determine, given a set of requirements and a controlled variable, whether the controlled variable is surjective with respect to the requirements.

In one or more embodiments, the surjectivity module 318 may be applied to all controlled variables whose type is a set with a small cardinality, e.g. Boolean-valued variables.

An example of a non-surjective controlled variable is as follows: The variable is Speed-Alarm and its type is the enumerated type {green, red}. The following two requirements are the only requirements in which Speed-Alarm appears as a controlled variable.

Requirement 1: When the Speed is greater than 60 kn, the Pilot-Display shall set the Speed-Alarm to green in order to notify the pilot that the Speed is not in the danger zone.

Requirement 2: When the Speed is less than 340 kn, the Pilot-Display shall set the Speed-Alarm to green in order to notify the pilot that the Speed is not in the danger zone.

The two requirements above imply that Speed-Alarm is always green, which indicates that the requirements are erroneous. In this case, it seems that the author of the requirements may have meant to write that Speed-Alarm should be green if the speed is between 60 kn and 340 kn and red otherwise. Even if it is assumed that the requirements are correct as written, then the type of Speed-Alarm can be updated to remove Red.

In one or more embodiments, if the surjectivity module 318 determines the following Formula is satisfiable, then an assignment satisfying the formula provides an element of Z (the type of controlled variable) for the controlled variable that is a witness to a surjectivity violation, because no matter what system state is present initially, and no matter what values are assigned to the other controlled variables, the requirements prohibit the controlled variable from ever taking on this value.

$$\langle \exists c{:}c \epsilon Z{:}\langle \forall m_1, \ldots, m_n, c_1, \ldots, c_k{:}$$
$$m_1 \epsilon T_1 \wedge \ldots \wedge m_n \epsilon T_n \wedge c_1 \epsilon Z_1 \wedge \ldots \wedge c_k \epsilon Z_k{:}$$
$$\neg R(m_1, \ldots, m_n, c, c_1, \ldots, c_k) \rangle \rangle$$

In one or more embodiments, the module 318 may begin by computing the controlled variable connected components, thereby allowing the use of the above formula only on the set of requirements that is relevant to the controlled variable c, making the analysis more scalable. In one or more embodiments the above formula may be used if the requirements do not contain any quantifiers or function symbols.

In one or more embodiments, associating a finite set with the controlled variable, as described above with respect to the self-conflicting module 310, may facilitate scalability. The module 318 may compute the controlled variable connected components of the given requirements and identify the component that includes the controlled variable c. Then, for every value v in V, the following formula is applied:

$$\Phi_{13}(R, \overrightarrow{m_{1\ldots n}}, \overrightarrow{T_{1\ldots n}}, c, \overrightarrow{c_{1\ldots k}}, \overrightarrow{Z_{1\ldots k}}, \sigma) = \begin{bmatrix} m_1 \in T_1 \wedge \ldots \wedge m_n \in T_n \wedge \\ c_1 \in Z_1 \wedge \ldots \wedge c_k \in Z_k \wedge \\ R(m_1, \ldots, m_n, c, c_1, \ldots, c_k)|_\sigma \end{bmatrix}$$

The output of the above formula may indicate the controlled variable is not surjective, that surjectivity could not be determined, or that the variable is surjective, and this output may be reported to a user. In one or more embodiments, the error localization module 303i may generate assignments when surjectivity violations are discovered.

The partial-surjectivity module 320, associated with S232, determines whether a controlled variable, c, is partially surjective. In one or more embodiments, a controlled variable is partially surjective with respect to a set of requirements, R, and a set of values, V, if for every value v∈V there is some system state for which c gets assigned v. In one or more embodiments, the partial-surjectivity module 320 may determine for a given set of requirements, a controlled variable, and a set of values, whether the controlled variable is surjective with respect to the requirements and values. In some instances, there may be controlled variables whose domain is very large (e.g., variables of type float). It may not make sense to require such variables to be surjective, but it may be desirable to check partial surjectivity, where the domain of interest is determined using analyses such as robustness analysis, normal case analysis, equivalence-class analysis, and any other suitable analysis. In one or more embodiments, the partial-surjectivity module 320 may use the same analyses as described above with respect to the surjectivity module 318, substituting V, a subset of Z for which it is expected that c is surjective, instead of Z. In one or more embodiments, the partial-surjectivity module 320 may report to the user whether the controlled variable is partially surjective, if partial surjectivity is undeterminable, or whether the controlled variable is not partially surjective. The error localization module 303i may determine and report the values of the controlled variable considered that violate partial surjectivity.

The conditional-surjectivity module 322, associated with S234, determines whether a controlled variable, c, is conditionally surjective. In one or more embodiments, a controlled variable is conditionally surjective with respect to a set of requirements, R, a set of values, V, and a condition if under the assumption that the condition holds, for every value v∈V, there is some system state for which c gets assigned v. In other words, the conditional-surjectivity module 322 may determine whether all specified output values of a controlled variable are possible under all specified modes (i.e., that surjectivity holds under certain modes).

In one or more embodiments, the conditional-surjectivity module 322 may determine, for a given set of requirements, a controlled variable, a set of values, and a condition, whether the controlled variable is surjective with respect to the requirements, values and the condition. Similarly to the conditionally completeness module 316, there may be conditions, such as certain modes of operation, where the values given to controlled variables are irrelevant (e.g., because the controlled variables are not used in these modes). The conditional-surjectivity module 322 may be used, in some embodiments, to show that certain controlled variables are partially surjective under the appropriate condition. Note that it is possible for a controlled variable to be (partially) surjective with respect to a set of requirements, but to not be conditionally surjective with respect to the same requirements and some condition. As such, conditional surjectivity may be a stronger verification and validation element than surjectivity because the controlled variable has to be surjective on the subset of the state space satisfying the condition. Conditional surjectivity may be used to check that requirements are surjective on the domain over which their output is meaningful.

In one or more embodiments, the conditional-surjectivity module 322 may begin by applying the following formula. If the formula is satisfiable, then an assignment satisfying the formula provides an element of V for the controlled variable c that is a witness to a conditional surjectivity violation, because no matter what condition-compatible system state is present initially, and no matter what values are assigned to the other controlled variables, the requirements prohibit the controlled variable from ever taking on this value.

$$\langle \exists c{:}c \epsilon V{:}\langle \exists m_1, \ldots, m_n, c_1, \ldots, c_k{:}$$
$$m_1 \epsilon T_1 \wedge \ldots \wedge m_n \epsilon T_n \wedge c_1 \epsilon Z_1 \wedge \ldots \wedge c_k \epsilon Z_k{:}$$
$$\phi(m_1, \ldots, m_n) \Rightarrow \neg R(m_1, \ldots, m_n, c, c_1, \ldots, c_k) \rangle \rangle$$

Based on the output of the above formula, the conditional-surjectivity module 322 may report to the user whether the controlled variable is not conditionally surjective, whether the conditional surjectivity determination is indeterminate, or if the controlled variable is conditionally surjective on V.

Turning to FIGS. 4-6, an example of the application of the requirement analysis module 118 is provided. FIG. 4 shows a user interface 400 displaying a set of requirements formalized into logical expressions and captured using semantic modeling technology. In the example shown herein, the requirements are about a temperature warning indicator. As the requirements have already been formalized and captured, the next step is to perform requirements analysis with the requirement analysis module 118 to ensure the requirements are accurate and consistent. In particular, the next step in the example shown herein is to apply the set conflicting module 312, and the module finds a conflict between requirements 18 and 32. FIG. 5, for example, shows the semantic model 500 capture of these two requirements for reference. After analyzing requirements 18 and 32, the set conflicting module 312 determines a conflict exists between these requirements, and the error localization module 303 provides the following test case exhibiting the conflict:

(TemperatureWarningMode Off), (TemperatureLow 12), and (ExternalTemperature 2)

As described above, a set of requirements is conflicting if there is some input value for the monitored variables for which the set of requirements cannot be satisfied, no matter what value is given to the controlled variables. In one or more embodiments, the rationale is for applying the set conflicting analysis is that when one set of requirements states that a controlled variable must have one value, while another set of requirements states that it must have a different value, a conflict exists.

The problem with requirements 18 and 32 is that requirement 18 says TemperatureWarning is On when ExternalTemperature is less than or equal to TemperatureLow, but requirement 32 says that TemperatureWarning is Off when TemperatureWarningMode is Off. Nothing stops both antecedents from being true at the same time, as witnessed by the counter-example test case generated by the error localization module 303.

In one or more embodiments, the resolution to this conflict may involve consultation with a systems engineer or revisiting the System Requirements Allocated To Software (SRATS) to understand the customer's intension. In the example herein, a high-level requirement was missing a monitored variable and was also missing text to distinguish whether the TemperatureWarningMode was On or Off. The refined and conflict-free requirements were corrected in the Specification Model, as shown in the Table 600 in FIG. 6, where the refinements are highlighted in bold. As described above, once the conflicts as well as the results from the other modules are resolved, the requirements may be ready to be passed to a software designer to be implemented.

Figure 7:
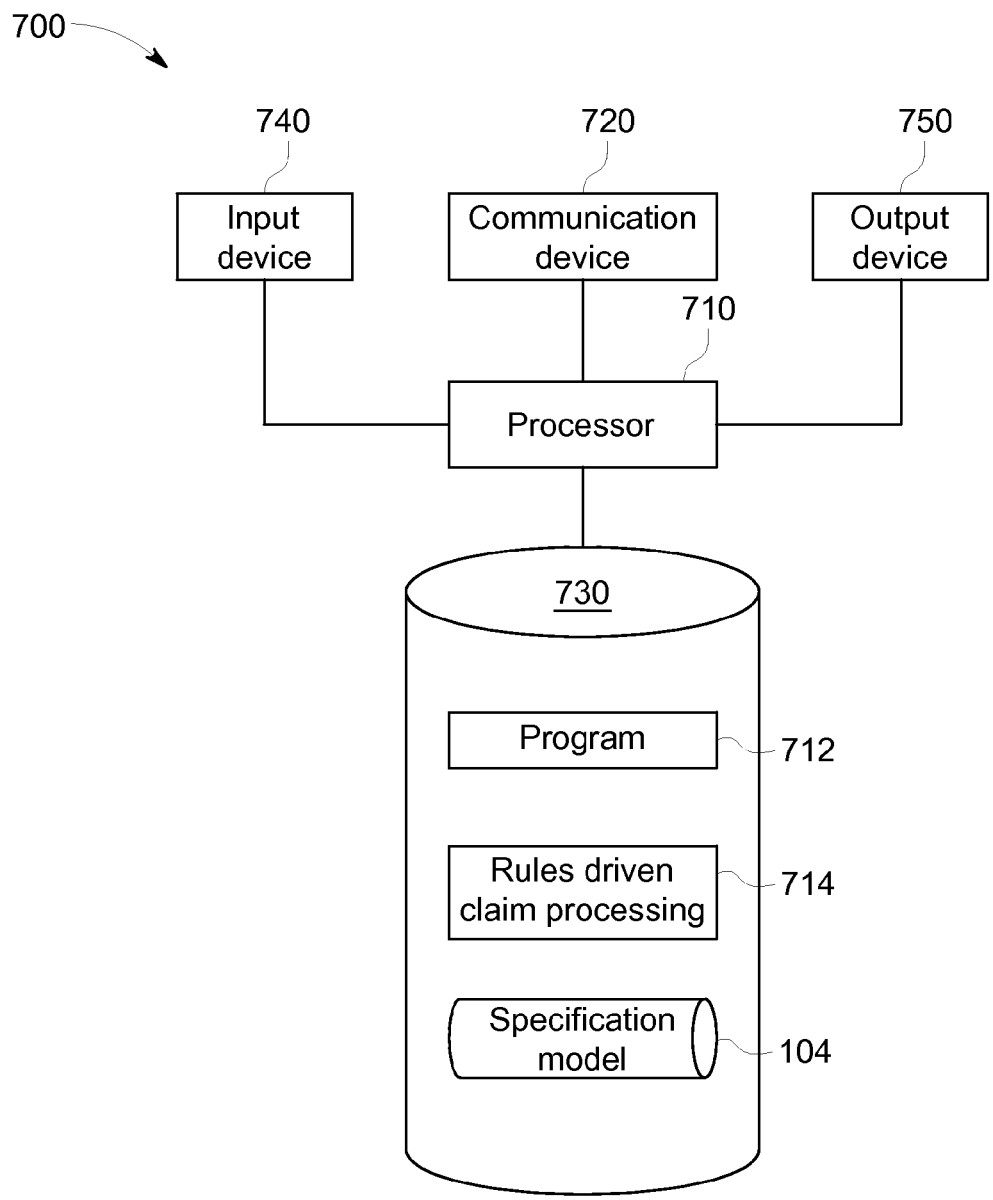
FIG. 7 is a block diagram of an automated test case generation processing tool or platform according to some embodiments.

Note the embodiments described herein may be implemented using any number of different hardware configurations. For example, FIG. 7 illustrates a requirement analysis processing platform 700 that may be, for example, associated with the system 100 of FIG. 1. The requirement analysis processing platform 700 comprises a requirement analysis processor 710, such as one or more commercially available Central Processing Units (CPUs) in the form of one-chip microprocessors, coupled to a communication device 720 configured to communicate via a communication network (not shown in FIG. 7). The communication device 720 may be used to communicate, for example, with one or more users. The requirement analysis platform 700 further includes an input device 740 (e.g., a mouse and/or keyboard to enter information about variables, clustering and optimization) and an output device 750 (e.g., to output and display the selected samples).

The requirement analysis processor 710 also communicates with a memory/storage device 730. The storage device 730 may comprise any appropriate information storage device, including combinations of magnetic storage devices (e.g., a hard disk drive), optical storage devices, mobile telephones, and/or semiconductor memory devices. The storage device 730 may store a program 712 and/or requirement analysis processing logic 714 for controlling the processor 710. The processor 710 performs instructions of the programs 712, 714, and thereby operates in accordance with any of the embodiments described herein. For example, the processor 710 may receive requirements and then may apply the requirement analysis module 118 via the instructions of the programs 712, 714.

The programs 712, 714 may be stored in a compressed, uncompiled and/or encrypted format. The programs 712, 714 may furthermore include other program elements, such as an operating system, a database management system, and/or device drivers used by the processor 710 to interface with peripheral devices.

As used herein, information may be "received" by or "transmitted" to, for example: (i) the platform 700 from another device; or (ii) a software application or module within the platform 700 from another software application, module, or any other source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a self-conflicting module and a completeness module. The method steps can then be carried out using the distinct software modules and/or sub-modules of the system, as described above, executing on one or more hardware processors 710 (FIG. 7). Further, a computer program product can include a computer-readable storage medium with code adapted to be implemented to carry out one or more method steps described herein, including the provision of the system with the distinct software modules.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A system for analyzing formal system requirements for software and hardware components in a software and hardware component specification model comprising:
   a communication device operative to communicate with a user to obtain two or more specification requirements, wherein each specification requirement is defined using a formal notation;
   a requirements analysis module to receive the two or more specification requirements, store the two or more specification requirements, and analyze each specification requirement individually and two or more specification requirements in conjunction to determine whether a conflict exists in the one or more specification requirements;
   an error localization module to identify each specification requirement involved in the conflict and indicates how the one or more specification requirement conflicts;
   a memory for storing program instructions;
   at least one requirements analysis processor, coupled to the memory, and in communication with requirements analysis module and the error localization module and operative to execute program instructions to:
   analyze each specification requirement individually to determine if the specification requirement is self-conflicting by executing a self-conflicting module of the requirements analysis module;
   generate an error explanation by executing the error localization module in response to the self-conflicting module determining the specification requirement self-conflicts;
   receive a first updated specification requirement from a user in response to the self-conflicting module determining the specification requirement is self-conflicting;
   repetitively analyze each updated requirement to determine if the specification requirement self-conflicts until the self-conflicting module determines the specification requirement is not self-conflicting;
   analyze two or more specification requirements in conjunction to determine if two or more specification requirements conflict by executing a set-conflicting module of the requirements analysis module after it is determined each specification requirement is not self-conflicting;
   generate an error explanation by executing the error localization module in response to the set-conflicting module determining two or more specification requirements conflict;
   receive a second updated specification requirement from a user in response to the set-conflicting module determining two or more specification requirements conflict; and
   repetitively analyze each updated specification requirement with the set-conflicting module to determine if the two or more specification requirements conflict until the set-conflicting module determines the two or more specification requirement are not self-conflicting;
   generate an indication that requirements analysis is complete for the one or more specification requirements and the one or more specification requirements is validated for use in software design.

2. The system of claim 1, wherein the specification requirement is self-conflicting if there is an input value of one or more monitored variables for which the specification requirement is unsatisfiable irrespective of a value given to a controlled variable.

3. The system of claim 1, wherein the set-conflicting module is operative to determine whether an input value of the monitored variables is unsatisfiable for the set of two or more specification requirements irrespective of a value of a controlled variable.

4. The system of claim 1 wherein the formal notation has a mathematically defined syntax and semantics.

5. The system of claim 1 wherein each specification requirement may be one of complete or incomplete.

6. The system of claim 1 wherein the execution of the requirements analysis module is dynamic.

7. The system of claim 1 wherein execution of the requirements analysis module further comprises execution of a type-safety module operative to indicate type violations in the specification requirements prior to execution of self-conflicting module.

8. The system of claim 7, wherein after execution of the type safety module and prior to execution of the self-conflicting module, the requirements analysis module executes:
   a contingency module operative to determine whether a single specification requirement is both satisfiable and falsifiable;
   a global-contingency module after execution of the contingency module, wherein the global-contingency module is operative to determine whether the set of two or more specification requirements is both satisfiable and falsifiable;
   an independence module after execution of the global-contingency module, wherein the independence module is operative to determine whether the set of specification requirements is independent.

9. The system of claim 8, wherein the self-conflicting module is executed after the independence module.

10. The system of claim 1, wherein the self-conflicting module is executed as the specification requirement is defined.

11. The system of claim 1, wherein after execution of the set-conflicting module, the requirements analysis module executes a completeness module operative to determine whether the set of two or more specification requirements uniquely specifies a value of each controlled variable, given one or more values for each of the one or more monitored variables.

12. The system of claim 11, wherein after execution of the completeness module, the requirements analysis module executes a conditional-completeness module operative to determine whether a set of specification requirements is complete for a set of specified modes.

13. The system of claim 12, wherein after execution of the conditionally completeness module, the requirements analysis module executes a surjectivity module operative to determine whether each output value of the one or more controlled variables over an enumerated type is possible.

14. The system of claim 13, wherein after execution of the surjectivity module, the requirements analysis module executes a partial-surjectivity module operative to determine whether each specified output value of the one or more controlled variables is possible.

15. The apparatus of claim 14, wherein after execution of the partial-surjectivity module, the requirements analysis module executes a conditional-surjectivity module operative to determine whether all specified output values of the one or more controlled variables are possible under one or more specified modes.

16. A method for analyzing formal system requirements for software and hardware components in a software and hardware component specification model comprising:
   receiving at least two specification requirements defined using a formal notation;
   determining if each of the specification requirements is self-conflicting via execution of a self-conflicting module;
   determining if two or more specification requirements conflict with each other via execution of a set-conflicting module after execution of the self-conflicting module;
   identifying each specification requirement involved in a conflict and how the one or more specification requirements conflicts via execution of an error localization module;
   receiving an updated specification requirement;
   repetitively analyzing each updated specification requirement with the self-conflicting module and the set-conflicting module; and
   generating an indication that requirements analysis is complete for the one or more specification requirements and the one or more specification requirements is validated for use in software design.

17. The method of claim 16 further comprising, prior to execution of the self-conflicting module:
   executing a type-safety module on the received specification requirements;
   executing a contingency module on the specification requirements following execution of the type-safety module;
   executing a global-contingency module on the specification requirements following execution of the contingency module;
   executing an independence module on the specification requirements following execution of the global-contingency module.

18. The method of claim 16 wherein the specification requirement is self-conflicting when an input value of a monitored variable for the specification requirement is unsatisfiable, irrespective of a value of a controlled variable.

19. The method of claim 16 wherein the self-conflicting module is executed as each specification requirement is formally defined.

20. The method of claim 16 wherein execution of the set-conflicting module further comprises:
   determining whether an input value of one or more monitored variables in the specification requirement is unsatisfiable for a set of two or more specification requirements irrespective of a value of a controlled variable of the specification requirement.

* * * * *